(12) United States Patent
Kwon et al.

(10) Patent No.: US 10,804,485 B2
(45) Date of Patent: Oct. 13, 2020

(54) DISPLAY APPARATUS

(71) Applicant: Samsung Display Co., Ltd., Yongin-Si, Gyeonggi-Do (KR)

(72) Inventors: Jaejoong Kwon, Suwon-si (KR); Hyesog Lee, Osan-si (KR); Yunseon Do, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 39 days.

(21) Appl. No.: 15/161,000

(22) Filed: May 20, 2016

(65) Prior Publication Data
US 2017/0012235 A1 Jan. 12, 2017

(30) Foreign Application Priority Data
Jul. 10, 2015 (KR) .......................... 10-2015-0098658

(51) Int. Cl.
*H01L 51/52* (2006.01)
*H01L 27/32* (2006.01)
(Continued)

(52) U.S. Cl.
CPC ........ *H01L 51/5237* (2013.01); *G06F 1/1637* (2013.01); *G09F 9/30* (2013.01);
(Continued)

(58) Field of Classification Search
CPC .... G06F 1/1601; G06F 1/1607; G06F 1/1616; G06F 1/1626; G06F 1/1637;
(Continued)

(56) References Cited

U.S. PATENT DOCUMENTS 8,081,430 B2 * 12/2011 Weber .................. C25D 11/16
340/815.53
8,797,630 B2 8/2014 Chen et al.
(Continued)

FOREIGN PATENT DOCUMENTS

CN 102609038 A 7/2012
CN 202711605 U 1/2013
(Continued)

OTHER PUBLICATIONS

S.O. Kasap, Optoelectronics and Photonics, 2nd edition, pp. 38-41 (Year: 2013).*
(Continued)

*Primary Examiner* — Roberto W Flores
(74) *Attorney, Agent, or Firm* — Lewis Rosa Rothgerber Christie LLP

(57) ABSTRACT

A display apparatus includes a display member including a display area, and a peripheral area adjacent the display area, a cover member on the display member, a first decoration member between the display member and the cover member, and including a bezel area overlapping the peripheral area, and a transmission area adjacent the bezel area, and overlapping the display area, and a second decoration member between the first decoration member and the cover member, and including a base member defining at least one recess portion overlapping the bezel area, and a filling member in the at least one recess portion, and including a refractive index that is lower than a refractive index of the base member.

29 Claims, 17 Drawing Sheets

(51) Int. Cl.
*H04M 1/02* (2006.01)
*G09F 9/30* (2006.01)
*G06F 1/16* (2006.01)

(52) U.S. Cl.
CPC ........ *H01L 27/323* (2013.01); *H01L 27/3237* (2013.01); *H01L 51/5246* (2013.01); *H01L 51/5253* (2013.01); *H01L 51/5275* (2013.01); *H04M 1/0266* (2013.01); *H01L 2251/5315* (2013.01)

(58) Field of Classification Search
CPC ...... G06F 1/1652; G06F 1/1684; G06F 3/041; G06F 3/044; G06F 3/048; G06F 2203/04102; G09G 2300/0413; G09G 2340/14; H04M 1/0266; H01L 51/5246; H01L 51/5271; H01L 27/323; H01L 51/5237; H01L 51/5275; H01L 27/3237; H01L 51/5253; H01L 2251/5315; G02F 1/133443; G09F 9/00; G09F 9/30
See application file for complete search history.

(56) References Cited

U.S. PATENT DOCUMENTS

| | | | |
|---|---|---|---|
| 2001/0009509 A1* | 7/2001 | An | G02F 1/133308 362/602 |
| 2003/0161093 A1* | 8/2003 | Lam | G06F 1/1616 361/679.24 |
| 2008/0062140 A1* | 3/2008 | Hotelling | G09G 3/3648 345/173 |
| 2009/0185115 A1 | 7/2009 | Nishida et al. | |
| 2010/0073336 A1* | 3/2010 | Lee | G06F 1/1601 345/204 |
| 2010/0182267 A1* | 7/2010 | Lee | G06F 3/044 345/173 |
| 2011/0012841 A1* | 1/2011 | Lin | G06F 3/041 345/173 |
| 2012/0050190 A1* | 3/2012 | Lai | G06F 3/041 345/173 |
| 2012/0050975 A1* | 3/2012 | Garelli | G06F 1/1615 361/679.27 |
| 2012/0103777 A1* | 5/2012 | Kang | G06F 3/044 200/600 |
| 2012/0162095 A1 | 6/2012 | Liang et al. | |
| 2012/0162542 A1* | 6/2012 | Carvajal | G06F 3/03547 348/734 |
| 2012/0170284 A1* | 7/2012 | Shedletsky | G02F 1/13318 362/355 |
| 2012/0242588 A1* | 9/2012 | Myers | G06F 1/1637 345/173 |
| 2013/0222736 A1* | 8/2013 | Qi | G06F 1/1601 349/65 |
| 2013/0265708 A1 | 10/2013 | Mathew et al. | |
| 2013/0301272 A1 | 11/2013 | Wang | |
| 2014/0198436 A1* | 7/2014 | Lim | H04M 1/0266 361/679.01 |
| 2014/0253606 A1* | 9/2014 | Yun | G02B 5/0278 345/690 |
| 2015/0123952 A1* | 5/2015 | Kim | G09G 3/3225 345/205 |
| 2015/0131035 A1* | 5/2015 | Chen | G02B 5/305 349/96 |
| 2015/0301417 A1* | 10/2015 | Park | G02F 1/136209 349/42 |
| 2015/0301652 A1* | 10/2015 | Yang | G06F 3/041 345/174 |
| 2016/0103250 A1* | 4/2016 | Snyder | G02B 27/30 428/41.8 |

FOREIGN PATENT DOCUMENTS

| | | |
|---|---|---|
| CN | 102998792 A | 3/2013 |
| CN | 204130082 U | 1/2015 |
| CN | 104423700 A | 3/2015 |
| KR | 10-2012-0043883 A | 5/2012 |
| KR | 10-2013-0084486 A | 7/2013 |
| KR | 10-1378223 B1 | 3/2014 |
| KR | 10-1407589 B1 | 6/2014 |
| KR | 10-2014-0111884 A | 9/2014 |
| KR | 10-2015-0009704 A | 1/2015 |
| WO | WO 2014/185894 A1 | 11/2014 |

OTHER PUBLICATIONS

EPO Extended Search Report dated Nov. 14, 2016, for corresponding European Patent Application No. 16175345.4 (6 pages).

* cited by examiner

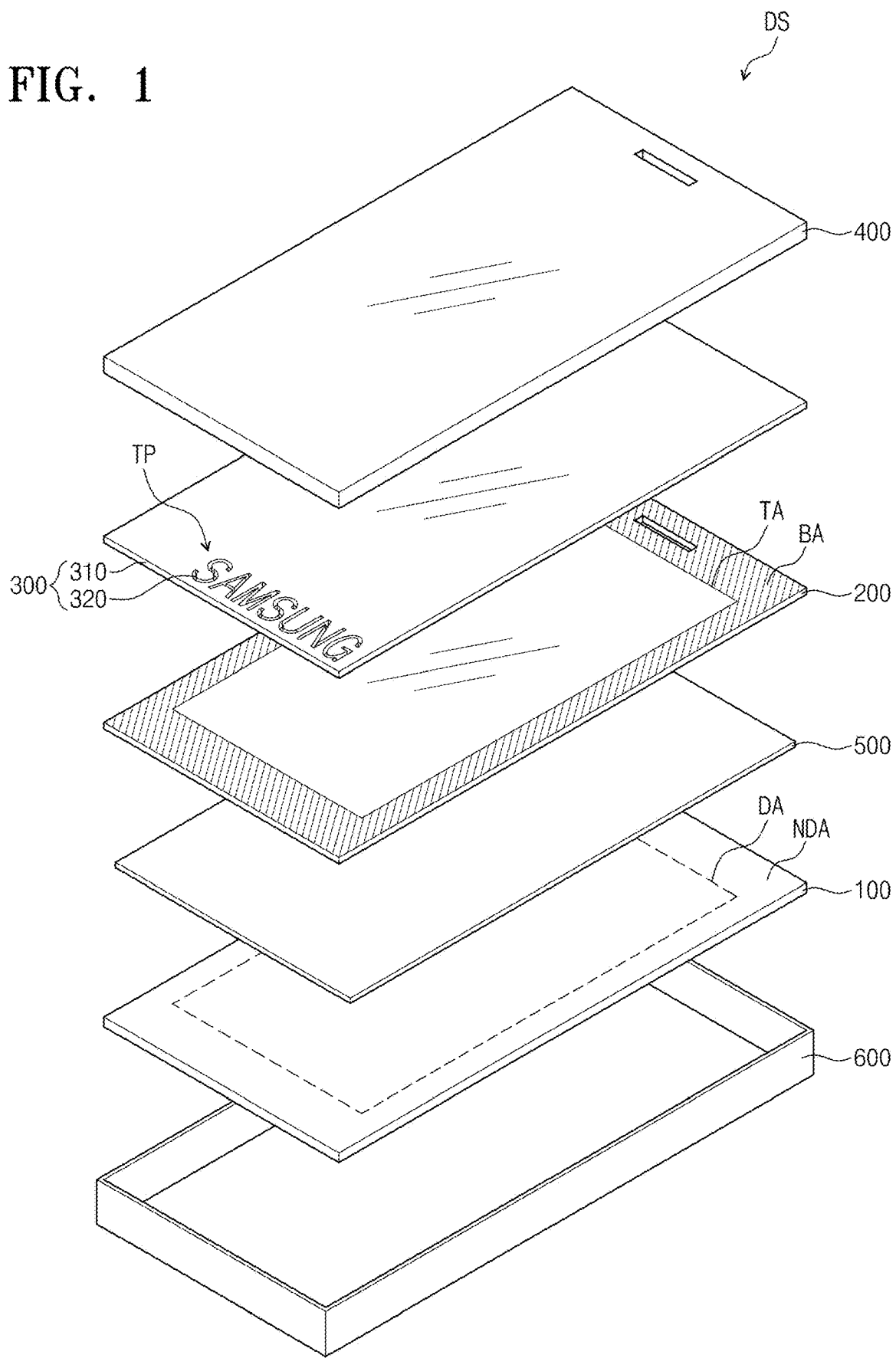

DISPLAY APPARATUS

CROSS-REFERENCE TO RELATED APPLICATION

This U.S. non-provisional patent application claims priority to, and the benefit of, Korean Patent Application No. 10-2015-0098658, filed on Jul. 10, 2015, the contents of which are hereby incorporated by reference in its entirety.

BACKGROUND

1. Field

The present disclosure relates to a thin display apparatus.

2. Description of the Related Art

Various display apparatuses applied to multimedia devices, such as a television set, a mobile phone, a navigation system, a computer monitor, a gaming device, etc., have been developed. In recent years, as demand for lightweight and thin display apparatuses in multimedia devices increases, the display apparatus is realized by stacking layers in an essentially close-packed manner to reduce a thickness of the display apparatus. The stack structure of the display apparatus is determined in consideration of visibility and reliability of the display apparatus.

SUMMARY

Embodiments of the present disclosure provide a display apparatus capable of preventing a light leakage phenomenon caused by thinning the display apparatus.

Embodiments of the inventive concept provide a display apparatus including a display member including a display area, and a peripheral area adjacent the display area, a cover member on the display member, a first decoration member between the display member and the cover member, and including a bezel area overlapping the peripheral area, and a transmission area adjacent the bezel area, and overlapping the display area, and a second decoration member between the first decoration member and the cover member, and including a base member defining at least one recess portion overlapping the bezel area, and a filling member in the at least one recess portion, and including a refractive index that is lower than a refractive index of the base member.

The refractive index of the filling member may be lower than a refractive index of a layer contacting the filling member.

The base member may include an adhesive material, and the base member may couple the cover member and the first decoration member.

The adhesive material may include an optical clear adhesive, a pressure sensitive adhesive, or an optical clear resin.

The layer contacting the filling member may include the cover member.

The display apparatus may further include an adhesive layer between the second decoration member and the cover member to couple the base member and the cover member.

The base member may include a transparent plastic film.

The layer contacting the filling member may include the adhesive layer.

The at least one recess portion may be recessed from one surface of the base member along a thickness direction of the base member.

The at least one recess portion may include a depth equal to, or smaller than, a thickness of the base member.

The base member may define an opening therethrough as the at least one recess portion.

The at least one recess portion may include a first recess portion defined by a front surface of the base member, and a second recess portion defined by a rear surface of the base member.

A depth of the first recess portion may be different than a depth of the second recess portion.

The first decoration member may include a transmission layer, and a pattern layer on one side of the transmission layer and defining the bezel area.

The pattern layer may include a white color.

The second decoration member may be directly on one surface of the cover member.

The display member may include a display panel for displaying an image at the display area, and a touch panel for calculating coordinate information corresponding to an external touch input at the cover member.

The display panel may include a base substrate, a display layer on the base substrate, and including at least one organic light emitting device at the display area, and a sealing layer on the display layer to seal the display layer.

The cover member may be bent with respect to a bending axis, and the second decoration member may be bent to correspond to a shape of the cover member.

The display member may be configured to display an image at the display area, and the cover member may cover the display area and the peripheral area, and may be configured to transmit the image to be recognized on the cover member.

Embodiments of the inventive concept provide a display apparatus including a display panel including a display area for displaying an image, and a peripheral area adjacent the display area, a cover member on the display panel, a first decoration member between the display panel and the cover member, and defining a transmission area overlapping the display area, and a bezel area adjacent the transmission area and overlapping the peripheral area, and a second decoration member between the first decoration member and the cover member, and including at least one transparent pattern overlapping the bezel area.

The second decoration member may further include a base member overlapping the transmission area and the bezel area, and defining at least one opening overlapping the bezel area, and a filling member in the at least one opening, and having a refractive index that is lower than a refractive index of the base member, and the at least one transparent pattern may be defined by the at least one opening and the filling member.

The base member may include an optical clear adhesive, a pressure sensitive adhesive, or an optical clear resin.

The base member may couple the first decoration member and the cover member, and the refractive index of the filling member may be lower than a refractive index of the cover member.

The base member may include a plastic film.

The display apparatus may further include an adhesive layer overlapping the at least one opening, and located between the base member and the cover member to couple the base member and the cover member.

The filling member may include a refractive index that is lower than a refractive index of the adhesive layer.

The filling member may include air.

The filling member may include a transparent polymer material.

According to the above, the display apparatus includes at least one transparent pattern disposed in the bezel area. The transparent pattern is defined by the recess portion, and by the filling member filled in the recess portion. The filling member has a refractive index that is lower than that of the layer that is adjacent the filling member to guide the light leaking through the bezel area such that the light travels to the edge of the display apparatus. Therefore, the light leakage phenomenon occurring in the bezel area is reduced.

In addition, the bezel area may be designed in various ways because the transparent pattern has various shapes. Thus, the appearance of the display apparatus may be improved.

BRIEF DESCRIPTION OF THE DRAWINGS

The above and other aspects of embodiments of the present disclosure will become readily apparent by reference to the following detailed description when considered in conjunction with the accompanying drawings, wherein:

FIG. 1 is an exploded perspective view showing a display apparatus according to an exemplary embodiment of the present disclosure;

DETAILED DESCRIPTION

Figure 2A:
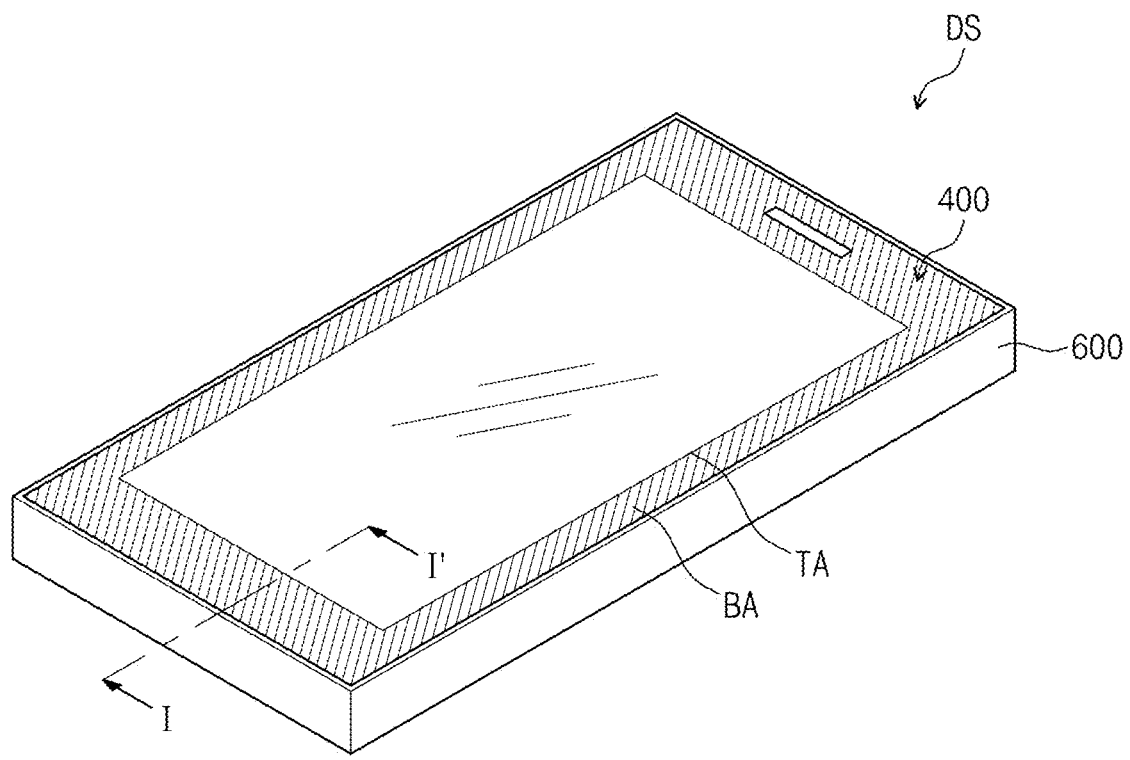
FIG. 2A is a perspective view showing the display apparatus shown in FIG. 1.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2B:
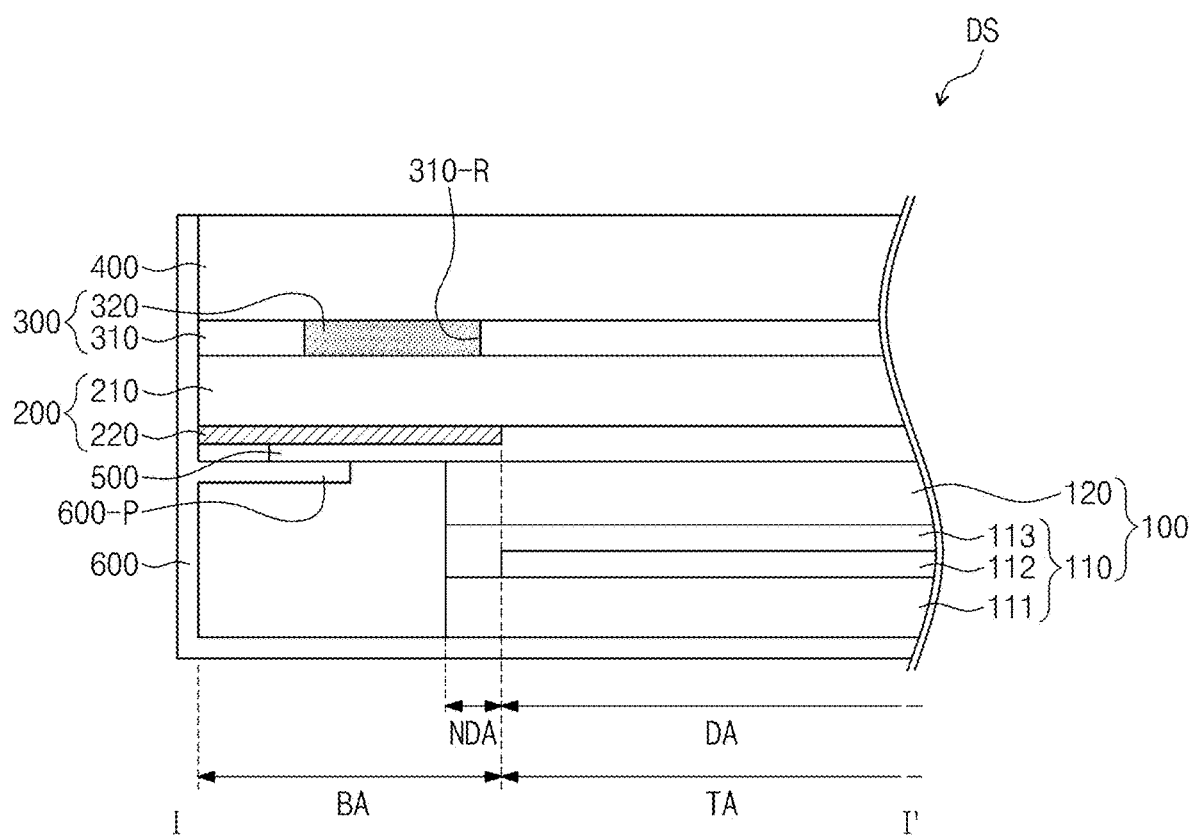
FIG. 2B is a cross-sectional view taken along a line I-I' of FIG. 2A.
Figure 3:
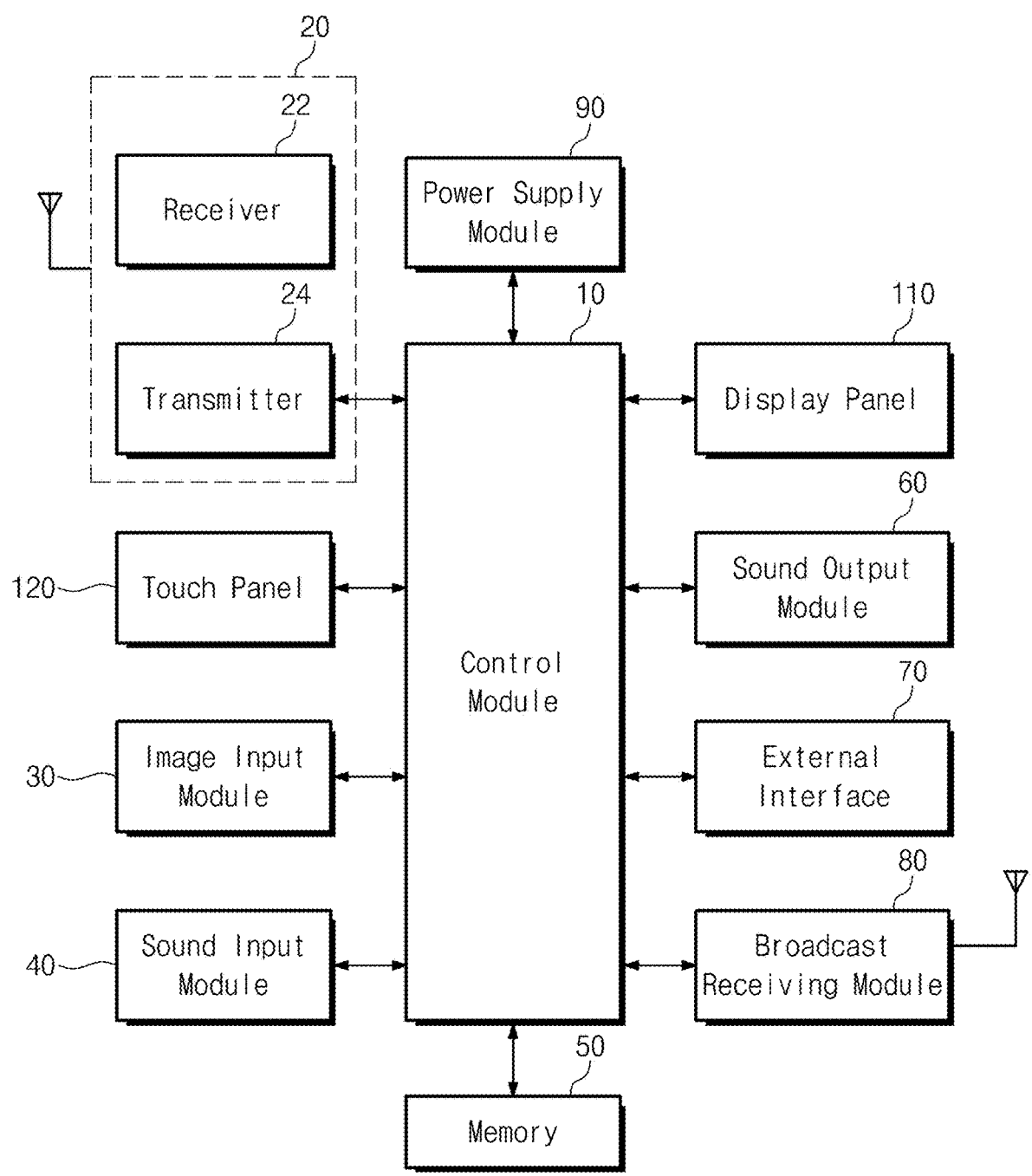
FIG. 3 is a block diagram showing the display apparatus shown in FIG. 1.

FIG. 1 is an exploded perspective view showing a display apparatus DS according to an exemplary embodiment of the present disclosure, FIG. 2A is a perspective view showing the display apparatus DS shown in FIG. 1 with elements of the display apparatus DS coupled to each other, FIG. 2B is a cross-sectional view taken along the line I-I' of FIG. 2A, and FIG. 3 is a block diagram showing the display apparatus DS shown in FIG. 1.

Referring to FIGS. 1, 2A, and 2B, the display apparatus DS includes a display member 100, a first decoration member 200, a second decoration member 300, a cover member 400, an adhesive member 500, and an accommodating member 600.

The display member 100 includes a display area DA and a peripheral area (e.g., a non-display area) NDA when viewed in a plan view. The display area DA is configured to display an image, and is defined in a center portion of the display member 100.

The peripheral area NDA is adjacent the display area DA. The peripheral area NDA may be substantially frame shaped to surround the display area DA.

The display member 100 includes a display panel 110 and a touch panel 120 for detecting an external touch input. The display panel 110 displays the image in response to electrical signals. The display panel 110 may be an organic light emitting display panel, a liquid crystal display panel, a plasma display panel, an electrophoretic display panel, or an electrowetting display panel, although the present invention is not limited to a specific display panel. Further, as an organic light emitting display panel, the display panel 110 may include a base substrate with a display layer thereon including at least one organic light emitting device.

Referring to FIG. 2B, the display panel 110 includes a base layer 111, a pixel layer 112, and a sealing layer 113. The base layer 111 includes an insulating material. For instance, the base layer 111 includes glass or plastic. However, the base layer 111 according to the present exemplary embodiment should not be limited thereto or thereby.

The pixel layer 112 is disposed on the base layer 111. The pixel layer 112 includes a plurality of pixels, with each pixel including at least one thin film transistor and a display element.

The display element may be an organic light emitting element, a liquid crystal capacitor, an electrophoretic element, or a conductive ink. In the present exemplary embodiment, the organic light emitting display panel including the organic light emitting element will be described as the display panel 110.

The pixels generate light in response to electrical signals to display the image. Accordingly, an area in which the pixel layer 112 is disposed may correspond to the display area DA.

The sealing layer 113 is disposed on the base layer 111 to cover the pixel layer 112. The sealing layer 113 seals the pixel layer 112 to protect the pixel layer 112 from external impacts. The sealing layer 113 may be formed of a transparent material to allow the light generated by the pixel layer 112 to be perceived outside the display member 100. The sealing layer 113 has a stack structure of a plurality of organic layers and/or inorganic layers. Therefore, the sealing layer 113 is provided in a thin film shape, or the like, and thus flexibility of the display panel 110 is improved.

In other embodiments, the sealing layer 113 may be a glass substrate or a plastic substrate. Thus, rigidity of the sealing layer 113 is improved, and reliability of the display panel 110 is improved. Meanwhile, the display panel 110 may further include a predetermined sealing member to couple the sealing layer 113 to the base layer 111.

The touch panel 120 calculates coordinate information corresponding to an external input, such as touch inputs generated by a stylus pen or a user's finger. The external input occurs at the cover member 400.

The touch panel 120 is directly disposed on the sealing layer 113. In this case, the touch panel 120 may be formed by directly depositing a plurality of touch patterns on the sealing layer 113, or the touch panel 120 may be attached on the sealing layer 113 after being separately formed.

The touch panel 120 may be integrally formed with the display panel 110 as a single unitary and individual unit. In this case, the touch panel 120 is disposed inside the display panel 110, although the touch panel 120 should not be limited to a specific embodiment.

In addition, the touch panel 120 may be a resistive layer type touch panel or an electrostatic capacitive type touch panel, although the present invention should not be limited thereto or thereby. In the display apparatus DS according to the present exemplary embodiment, the touch panel 120 may be omitted.

Referring to FIG. 3, the display member 100 may further include elements, which are used to perform functions of the display apparatus DS, in addition to the display panel 110 and the touch panel 120. For instance, the display member 100 may further include a control module 10, a wireless communication module 20, an image input module 30, a sound input module 40, a memory 50, a sound output module 60, an external interface 70, a broadcast receiving module 80, and a power supply module 90.

The control module 10 controls overall operation of the device (e.g., operation of a mobile phone). For example, the control module 10 controls and performs functions related to a voice communication, a data communication, a video communication, etc. In addition, the control module 10 may control operation of the touch panel 120 in addition to conventional functions. For instance, the control module 10 controls the display panel 110, the image input module 30, the memory 50, and the sound output module 60 on the basis of the coordinate information provided from the touch panel 120.

The wireless communication module 20 transmits a wireless signal to, and receives a wireless signal from, a mobile communication base station using an antenna. For instance, the wireless communication module 20 transmits and receives sound data, text data, image data, and control data. The wireless communication module 20 includes a transmitter 24 that modulates a signal to be transmitted, and includes a receiver 22 that demodulates a signal to be received.

The image input module 30 processes an image signal to convert the image signal to image data, such that images represented by the image data are displayed through the display panel 110. The sound input module 40 receives an external sound signal through a microphone, and converts the sound signal to electric voice data in a call mode, a record mode, or a voice recognition mode. The sound input module 40 performs various noise removal algorithms to remove noises generated when the external sound signal is input to the sound input module 40.

The sound output module 60 converts the sound data provided from the wireless communication module 20, or converts the sound data stored in the memory 50, and outputs the converted sound data.

The external interface 70 serves as an interface between a mobile terminal and external devices, such as a wired/wireless headset, an external charger, a wired/wireless data port, a card socket (e.g., a memory card and an SIM/UIM card), etc.

The broadcast receiving module 80 receives a broadcast signal transferred through a satellite, or through a ground wave, and converts the broadcast signal to broadcast data that may be output to the sound output module 60 and to the display panel 110.

Referring to FIGS. 1, 2A, and 2B, the first decoration member 200 is disposed between the display member 100 and the cover member 400. The first decoration member 200 includes a transmission area TA and a bezel area BA when viewed in a plan view.

The transmission area TA overlaps the display area DA. The transmission area TA transmits the light to allow the image displayed on the display area DA to be perceived from the outside.

The bezel area BA overlaps the peripheral area NDA. The bezel area BA is adjacent the transmission area TA, and defines the transmission area TA. The bezel area BA blocks the light passing through the peripheral area NDA to allow the peripheral area NDA to not be perceived from the outside.

The first decoration member 200 includes a transmission layer 210 and a pattern layer 220. The transmission layer 210 includes a material having high light transmittance such that the display area DA under the transmission layer 210 is perceived from the outside. The transmission layer 210 overlaps the bezel area BA and the transmission area TA, and defines the transmission area TA.

The pattern layer 220 is on a surface of the transmission layer 210. The pattern layer 220 includes a material having low light transmittance to block light. The pattern layer 220 may have a predetermined color. The pattern layer 220 reflects the light that is incident thereto to allow the light to have a predetermined color. The pattern layer 220 may have various colors, which may be determined depending on a reflectance of the pattern layer 220, or depending on a pigment of the pattern layer 220. The color of the pattern layer 220 may be referred to as a color of the bezel area BA. The pattern layer 220 may include a material having high light reflectance, or having pigment having a bright color tone. In the present exemplary embodiment, the pattern layer 220 may have a white color as an example.

The second decoration member 300 covers the bezel area BA and the transmission area TA. The second decoration member 300 transmits the light to allow the bezel area BA and the transmission area TA to be perceived from the outside. The second decoration member 300 includes a base member 310 and a filling member 320.

The base member 310 overlaps the bezel area BA and the transmission area TA. The base member 310 transmits the light exiting through the transmission area TA. The base member 310 includes a transparent insulating material, which has high light transmittance and is not opaque. As an example, the base member 310 may be a transparent adhesive. The base member 310 couples the first decoration member 200 and the cover member 400. For instance, the base member 310 may be an optical clear adhesive (OCA), a pressure sensitive adhesive (PSA), or an optical clear resin (OCR). According to another embodiment, the base member 310 may be a transparent plastic film. In this case, because the base member 310 has relatively high transmittance, visibility of the image displayed in the display area DA of the display apparatus DS may be improved. However, the base member 310 should not be particularly limited to the above-mentioned embodiments. The base member 310 includes at least one recess portion 310-R defined therein. The recess portion 310-R is recessed from one surface of the base member 310 along a thickness direction of the base member 310 to define a corresponding space. In embodiments of the present invention, the recess portion 310-R may be a hole, an opening, or a space, defined by the base member.

The filling member 320 is filled in the space defined by the recess portion 310-R. The filling member 320 may include a transparent insulating material (e.g., a transparent polymer material). In the present exemplary embodiment, the filling member 320 may include a material having a refractive index that is lower than a refractive index of the base member 310. Accordingly, the second decoration member 300 may be divided into two parts having different refractive indices. The filling member 320 includes the material having the refractive index that is lower than about 1.5. Because the material having the refractive index lower than about 1.5 may include air, the filling member 320 may include a specific material, or may be replaced with a space filled with air.

For instance, the filling member 320 may be air, an optical adhesive having low refractive index, or a resin layer having low refractive index. In more detail, the filling member 320 may be acrylated fluoro resins, methoxyperfluoro-hexane, fluoropolymer (e.g., tetrafluoroethylene, hexafluoropropylene, vinylidene fluoride, THV, etc.), or aerogel. However, the second decoration member 300 should not be limited thereto or thereby. That is, the second decoration member 300 may include a filling member 320 that includes one or more various materials.

The second decoration member 300 includes at least one transparent pattern TP. The transparent pattern TP may be a bezel design of the display apparatus DS, or may be a specific trademark on the display apparatus DS. The transparent pattern TP may have various shapes when viewed in a plan view. In the present exemplary embodiment, as a representative example, the word "SAMSUNG®" may be the transparent pattern TP, as shown in FIG. 1 (SAMSUNG® is a registered trademark of Samsung C&T Corporation, Republic of Korea).

The transparent pattern TP is defined by the recess portion 310-R and the filling member 320. The shape of the transparent pattern TP is determined by the shape of the recess portion 310-R. According to the recess portion 310-R, the transparent pattern TP may be an intaglio or relief pattern.

In addition, characteristics of the transparent pattern TP may depend on the material of the filling member 320. In detail, the visibility of the transparent pattern TP may be varied in accordance with the refractive index of the filling member 320. This will be described in detail later.

The cover member 400 is disposed on the display member 100. The cover member 400 covers an entire surface of the second decoration member 300. The cover member 400 may include a transparent insulating material, and may include a material having high transmittance to allow the image displayed in the display area DA to be perceived from the outside. In the present exemplary embodiment, the cover member 400 may be a window of the display apparatus DS. The cover member 400 protects the display member 100, the first decoration member 200, and the second decoration member 300. In addition, because external inputs may be applied to the cover member 400, the cover member 400 may be formed of a material having a predetermined rigidity. For instance, the cover member 400 may include a transparent plastic or glass, although the present invention should not be limited thereto or thereby. The cover member 400 may include various materials having high transmittance.

The adhesive member 500 is between the display member 100 and the first decoration member 200, and may couple the display member 100 to the first decoration member 200. The adhesive member 500 overlaps the display area DA. The adhesive member 500 may include an adhesive material having high transmittance. As a size of an area that the adhesive member 500 overlaps each of the display member 100 and the first decoration member 200 increases, a fixing force between the display member 100 and the first decoration member 200 may be improved. The adhesive member 500 might overlap only the bezel area BA. In this case, because the adhesive member 500 does not overlap the display area DA, the visibility of the image may be improved. Meanwhile, the adhesive member 500 may be omitted according to embodiments.

The accommodating member 600 defines an inner space therein. The display member 100, the first decoration member 200, and the second decoration member 300 are accommodated in the inner space of the accommodating member 600. The accommodating member 600 and the cover member 400 are coupled to each other to define an outer shape of the display apparatus DS. The accommodating member 600 includes a protruding portion 600-P. The protruding portion 600-P supports the first and second decoration members 200 and 300. Therefore, the accommodating member 600 stably accommodates elements contained therein, and has a step difference for supporting elements thereon. Elements used to drive the display apparatus DS and to apply a source voltage to the display apparatus DS may be accommodated in the inner space of the accommodating member 600. The display apparatus DS according to the present exemplary embodiment should not be limited thereto or thereby.

Figure 4A:
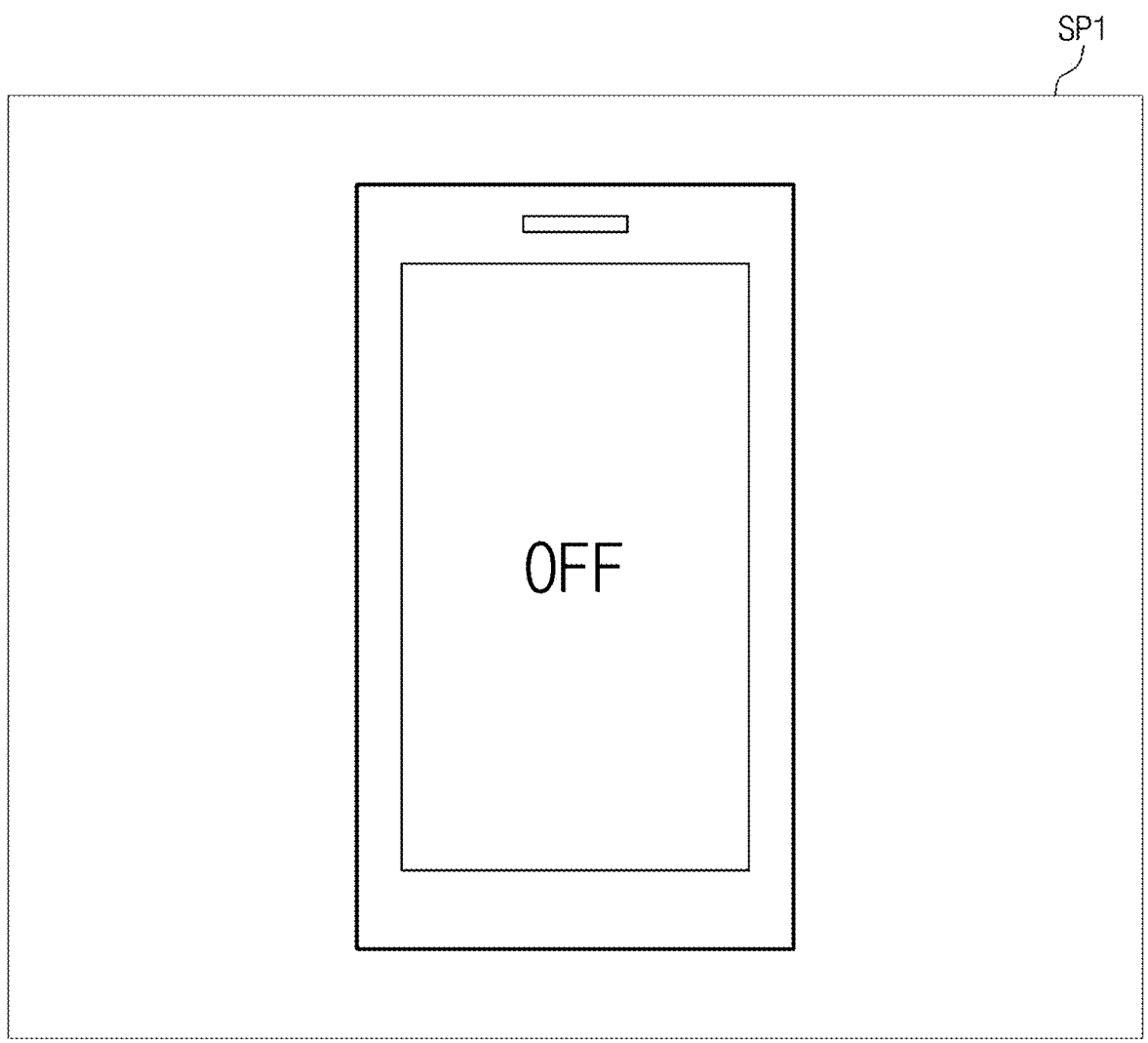
FIGS. 4A to 4C are plan views showing operation states of the display apparatus shown in FIG. 1.
Figure 4B:
Figure 4C:

FIGS. 4A to 4C are plan views showing operation states of the display apparatus shown in FIG. 1, and show the operations of the display apparatus DS in different environmental conditions (e.g., in a bright space or in a dark space).

FIG. 4A shows a state in which a power of the display apparatus DS is turned off in a bright space SP1, FIG. 4B shows a state in which the power of the display apparatus DS is turned on in the bright space SP1, and FIG. 4C shows a state in which the power of the display apparatus DS is turned on in a dark space SP2.

The bright space SP1 corresponds to bright environmental conditions in which an external light source exists outside the display apparatus DS. A user may easily recognize the display apparatus DS in the bright space SP2. The dark space SP2 corresponds to dark environmental conditions in which no external light source, or no significant light source, exists nearby outside the display apparatus DS. The user may have difficulty recognizing the display apparatus DS, or may have difficulty distinguishing the bezel area BA and the transmission area TA while the power of the display apparatus DS is turned off.

As shown in FIG. 4A, the transparent pattern (e.g., the word "SAMSUNG") does not appear when the power of the display apparatus DS is turned off. Accordingly, the user recognizes the bezel area BA, although the transparent pattern of "SAMSUNG" is not perceived from the outside.

As shown in FIG. 4B, when the power of the display apparatus DS is turned on, the pattern of "SAMSUNG" may be recognized. However, the visibility of the pattern of "SAMSUNG" may be slightly deteriorated in the bright environmental conditions of the bright space SP1.

When the power of the display apparatus DS is turned on, a light leakage phenomenon may occur in the display apparatus DS. However, the light leakage phenomenon of the display apparatus DS may be difficult to recognize in the bright space SP1. Thus, the user may recognize the image displayed through the display apparatus DS without recognizing the pattern of "SAMSUNG".

As shown in FIG. 4C, when the display apparatus DS is operated in the dark, or low light, environmental conditions of the dark space SP2, the visibility of the pattern of "SAMSUNG" may be improved. The user may relatively easily recognize the pattern of "SAMSUNG" when compared with the pattern of "SAMSUNG" in the bright space SP1.

The display apparatus DS according to the present exemplary embodiment may have the bezel design realized in the dark space SP2. The pattern of the word "SAMSUNG" may be recognized in certain situations (e.g., when the power of the display apparatus DS is turned on in the dark space S2), and may be difficult to recognize in other situations. Accordingly, the pattern of the word "SAMSUNG" serves as a hidden design of the display apparatus DS.

The display apparatus DS according to the present exemplary embodiment may provide differently realized transparent patterns or shapes depending on whether the power of the display apparatus DS is turned on or off, and depending on whether the display apparatus DS is in the bright space or in the dark space. Therefore, the display apparatus DS may be designed in various shapes, and appearance of the display apparatus DS may be improved.

Figure 5A:
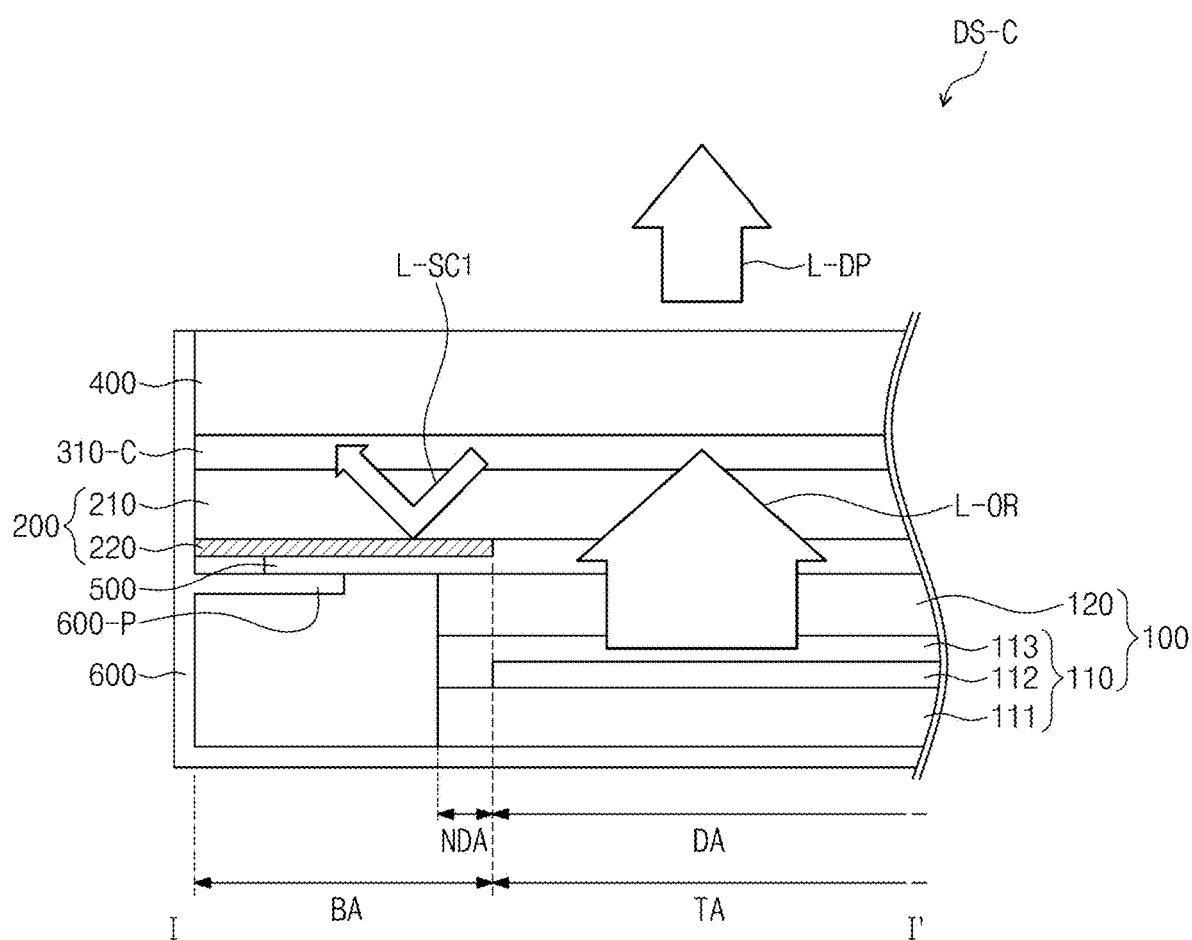
FIG. 5A is a partial cross-sectional view showing an optical path of a comparison example of a display apparatus.
Figure 5B:
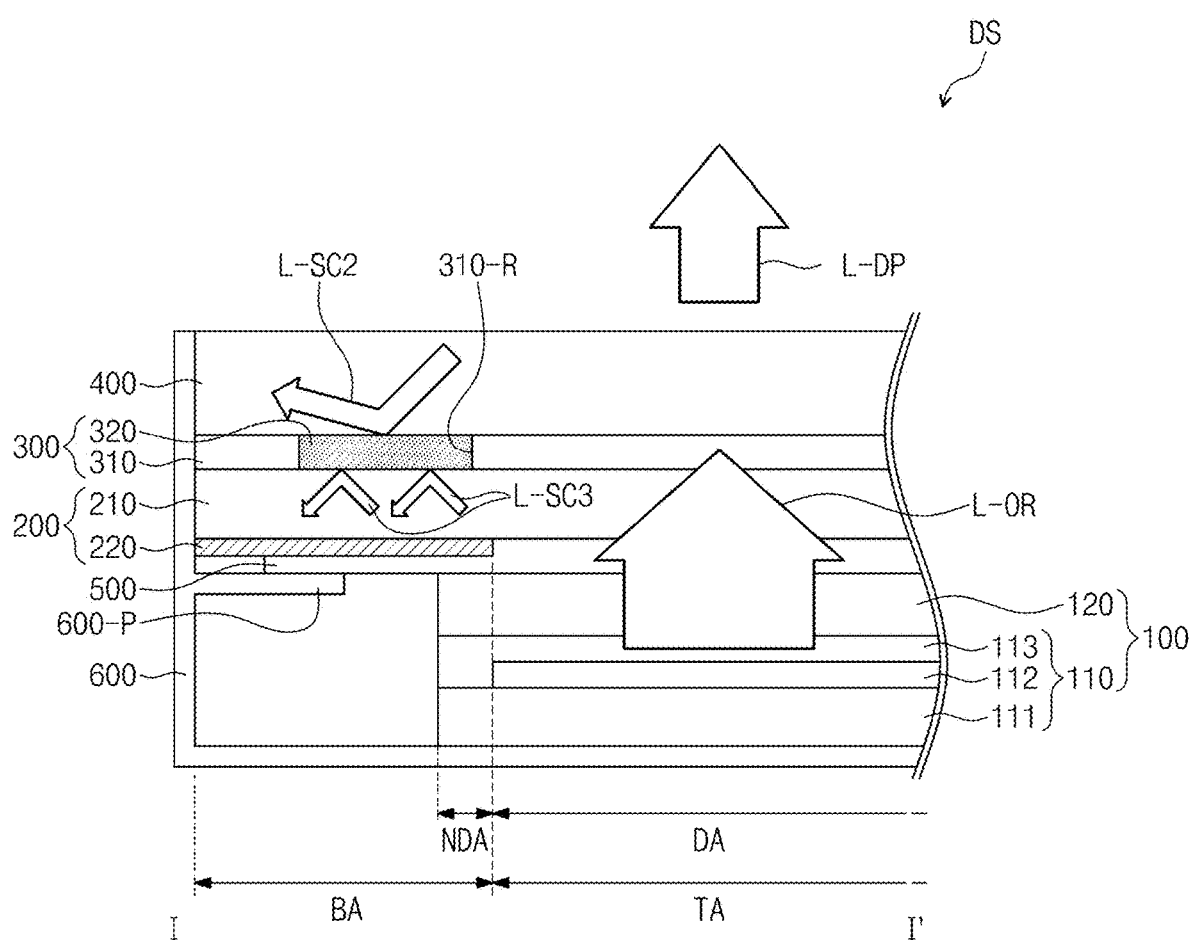
FIG. 5B is a partial cross-sectional view showing an optical path of a display apparatus according to an exemplary embodiment of the present disclosure.

FIG. 5A is a partial cross-sectional view showing an optical path of a comparison example of a display apparatus DS-C, and FIG. 5B is a partial cross-sectional view showing an optical path of a display apparatus DS according to an exemplary embodiment of the present disclosure.

The comparison example of the display apparatus DS-C shown in FIG. 5A, and the display apparatus DS shown in FIG. 5B, include the same elements except for the second decoration member 300. Hereinafter, the display apparatus DS will be described in detail with reference to FIGS. 5A and 5B.

Referring to FIGS. 5A and 5B, the display member 100 generates a light L-OR used to display the image, and allows the light L-OR to travel upwardly (e.g., in an upper direction) in response to the power applied thereto. A portion, or component, of the light L-OR used to display the image includes a light L-DP traveling through the display area DA that is perceived from the outside, and that provides the user with information.

Meanwhile, the display member 100 has a stack structure of a plurality of layers. When the display member 100 becomes thin, a portion of, or component of, the light L-OR used to display the image may be leaked to the peripheral area NDA and the bezel area BA through the layers. As a result, lights L-SC1, L-SC2, and L-SC3 leaking through the layers are respectively generated in the display apparatus DS, and in the comparison example of the display apparatus DS-C.

As shown in FIG. 5A, the comparison example of the display apparatus DS-C does not include the second decoration member 300. In detail, the comparison example of the display apparatus DS-C includes a base member 310-C that does not include the recess portion.

Accordingly, the light L-SC1 travels to the outside of the comparison example of the display apparatus DS-C through the cover member 400. An amount of the light leaking to the outside of the comparison example of the display apparatus DS-C depends on a difference between a refractive index of the first decoration member 200, a refractive index of the base member 310-C, and a refractive index of the cover member 400. Generally, most of the light L-SC1 travels to the outside of the comparison example of the display apparatus DS-C.

When the power of the comparison example of the display apparatus DS-C is turned on, the user recognizes the light L-DP traveling to the display area DA, and recognizes the light L-SC1 leaking through the bezel area BA. The light L-SC1 leaking through the bezel area BA causes a deterioration of the visibility of the image displayed in an area adjacent the bezel area BA.

Contrastingly, the display apparatus DS according to the present exemplary embodiment includes the second decoration member 300, as shown in FIG. 5B. The lights L-SC2 and L-SC3 leaking through the bezel area BA travel to a side surface of the filling member 320 after being incident to the filling member 320, or are partially absorbed by the filling member 320.

The filling member 320 includes the material having the refractive index that is lower than the refractive index of the base member 310. The light incident to the filling member 320, which has the relatively small refractive index, may be reflected or refracted at an angle greater than that of the light incident to the base member 310.

The refractive index of the filling member 320 may be controlled to be different according to the refractive index of the layer through which the light incident to the filling member 320 passes. In detail, the filling member 320 may have the refractive index that is lower than a refractive index of a layer making contact with the filling member 320. For instance, the refractive index of the filling member 320 may be lower than the refractive index of the cover member 400. Therefore, among the lights L-SC2 and L-SC3 leaking through the bezel area BA, the light L-SC2 incident to the second decoration member 300 from the cover member 400 is refracted or reflected from the filling member 320 at an angle that is greater than an incident angle which the light L-SC2 incident on the filling member 320.

In addition, the refractive index of the filling member 320 may be lower than the refractive index of the first decoration member 200. Thus, among the lights L-SC2 and L-SC3 leaking through the bezel area BA, the light L-SC3 incident to the second decoration member 300 from the first decoration member 200 is refracted or reflected from the filling member 320 at an angle that is less than an incident angle which the light L-SC3 incident on the filling member 320.

The filling member 320 guides the lights L-SC2 and L-SC3 leaking through the bezel area BA thereto. Accordingly, the lights L-SC2 and L-SC3 leaking through the bezel area BA travel to an edge of the cover member 400 or the first decoration member 200 without traveling in the upper direction thereof. Therefore, the light leakage phenomenon of the display apparatus DS may be reduced.

In addition, the display apparatus DS according to the present exemplary embodiment may utilize the light leakage phenomenon in a view point of design concept. As described above, the light incident to the filling member 320 among the lights L-SC2 and L-SC3 leaking through the bezel area BA is less likely to travel in the upper direction of the cover member 400. However, a portion of the lights L-SC2 and L-SC3 leaking through the bezel area BA is reflected by the pattern layer 220 without being guided by the filling member 320, and is then perceived in the upper direction.

The user recognizes the area corresponding to the filling member 320 as a dark area, and recognizes the area in which the filling member 320 is not disposed as a bright area, due to the portion of the lights L-SC2 and L-SC3 leaking through the bezel area BA. That is, the area in which the recess portion 310-R is defined and the bezel area BA are perceived as having different brightnesses.

Accordingly, the user may recognize the transparent pattern TP (refer to FIG. 1) defined in the bezel area BA by using the light leakage phenomenon of the display apparatus DS. The display apparatus DS may realize the transparent pattern TP controlled by the operation of the display apparatus DS even though a separate light source does not exist. The display apparatus DS according to the present exemplary embodiment may be designed by using the light leakage phenomenon occurring in the display apparatus DS as a light source.

Figure 6A:
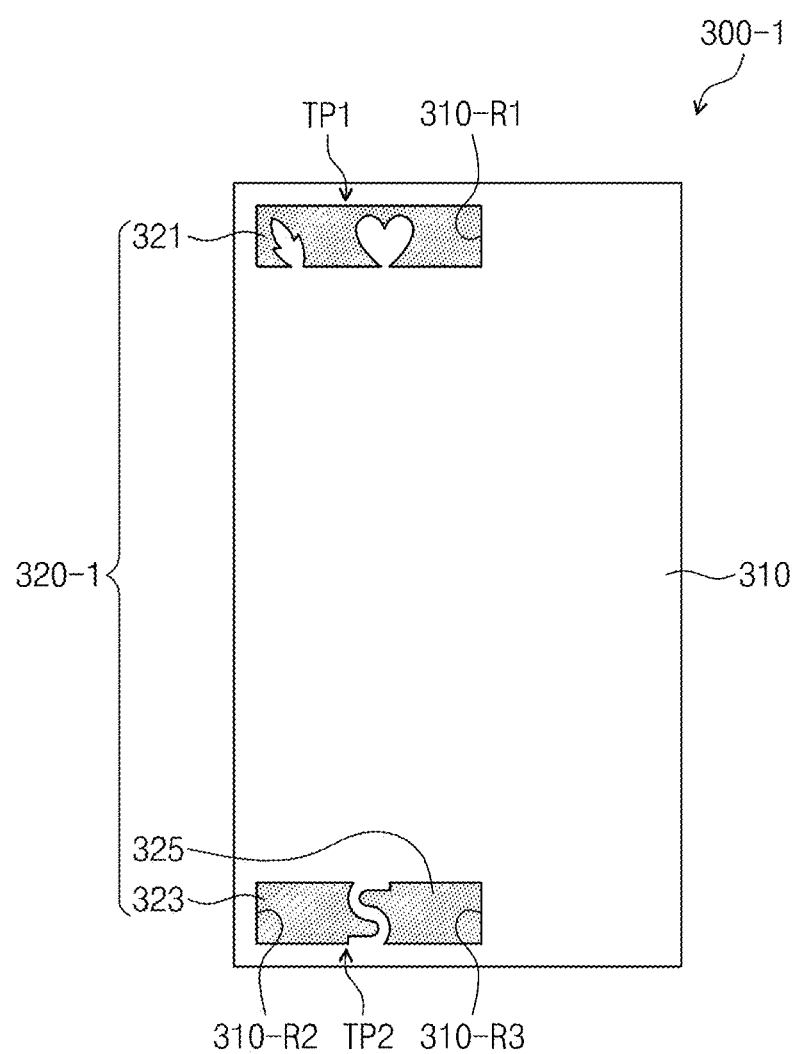
FIG. 6A is a plan view showing an element of a display apparatus according to an exemplary embodiment of the present disclosure.
Figure 6B:
FIGS. 6B and 6C are photographs showing operation states of the display apparatus including the element shown in FIG. 6A.
Figure 6C:
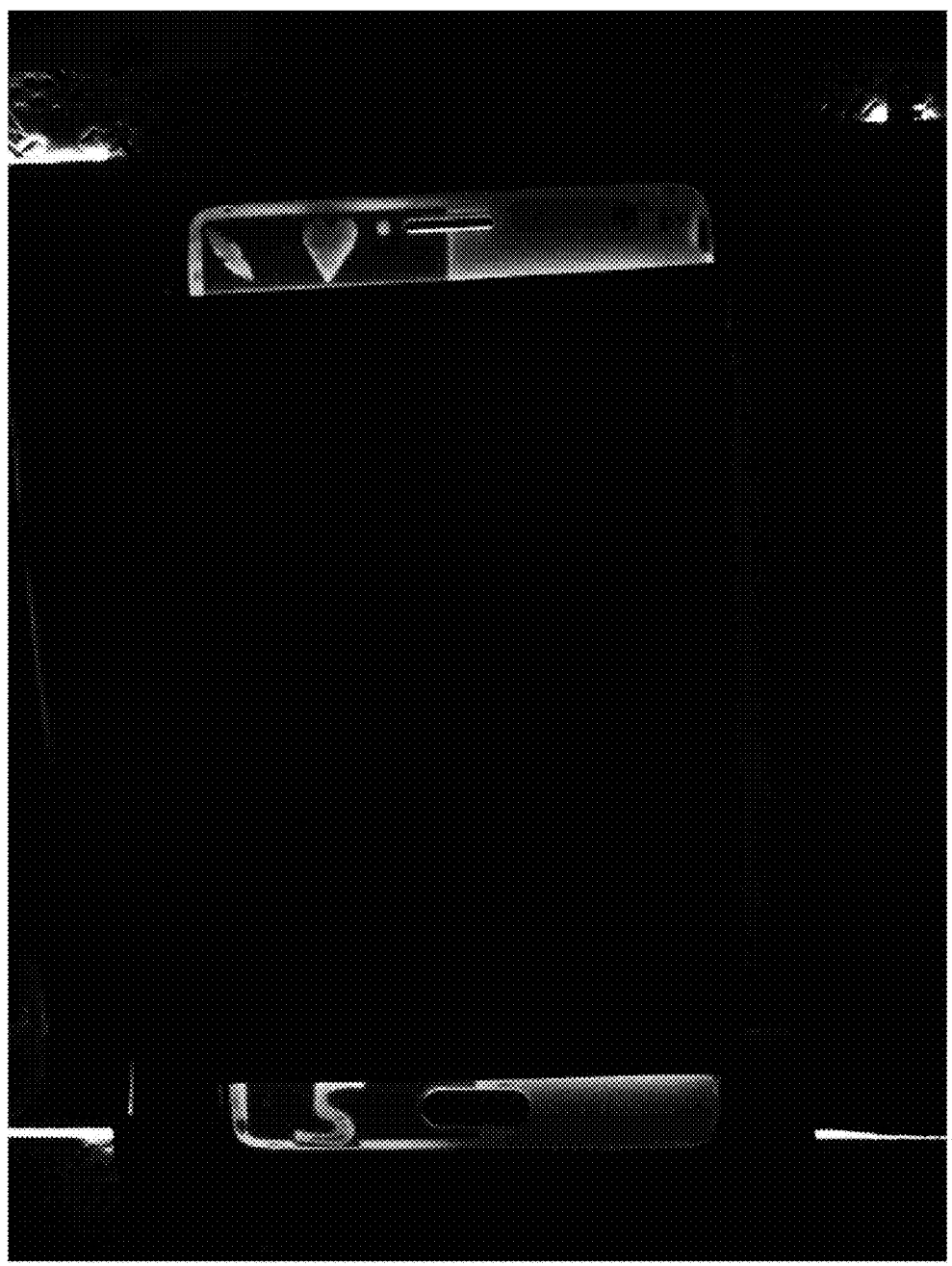

FIG. 6A is a plan view showing an element of a display apparatus according to an exemplary embodiment of the present disclosure, and FIGS. 6B and 6C are photographs showing operation states of the display apparatus including the element shown in FIG. 6A.

FIG. 6A shows a second decoration member 300-1 according to an exemplary embodiment. FIG. 6A shows a state in which a power of the display apparatus is turned off in a dark space. FIG. 6B shows a result obtained by taking a picture of the display apparatus while the display area DA (refer to FIG. 1) is covered. Hereinafter, the second decoration member 300-1 will be described in detail with reference to FIGS. 6A to 6C.

The display apparatus according to the present exemplary embodiment may include a transparent pattern having various shapes, and may include a plurality of patterns. As shown in FIG. 6A, the second decoration member 300-1 includes a first transparent pattern TP1 and a second transparent pattern TP2.

The first transparent pattern TP1 is defined by a first recess portion 310-R1 and a first filling member 321. The second transparent pattern TP2 is defined by a second recess portion 310-R2, a second filling member 323, a third recess portion 310-R3, and a third filling member 325.

As described above, the shape of the first transparent pattern TP1 is determined by the shape of the first recess portion 310-R1. In addition, the shape of the second transparent pattern TP2 is determined by the shape of the second and third recess portions 310-R2 and 310-R3.

The first, second, and third filling members 321, 323, and 325 may respectively determine the brightness of the first and second transparent patterns TP1 and TP2. The first, second, and third filling members 321, 323, and 325 may include various materials. The first, second, and third filling members 321, 323, and 325 may include the same material, or may include different materials from each other.

For instance, the first, second, and third filling members 321, 323, and 325 may include the same material. In this case, the brightness of the first transparent pattern TP1 may be substantially the same as the brightness of the second transparent pattern TP2.

As mentioned above, the first, second, and third filling members 321, 323, and 325 may include different materials from each other. In this case, the brightness of the first transparent pattern TP1 may be different from the brightness of the second transparent pattern TP2. As described above, because the display apparatus includes the transparent patterns having various shapes and brightnesses, a variety of designs of the display apparatus may be improved.

Referring to FIG. 6B, the first and second transparent patterns TP1 and TP2 are not readily recognized when the power of the display apparatus is turned off. Accordingly, the bezel area BA (refer to FIG. 1) is recognized as having only the white color.

Referring to FIG. 6C, when the power of the display apparatus DS is turned on in the dark space, the first and second transparent patterns TP1 and TP2 are recognized. As described above, the area in which the recess portion 310-R is defined and in which the filling member 320 is disposed is relatively dark, and the area corresponding to the shape of the base member 310 is relatively bright.

The light leaking through the display area DA may be used for a factor in the design of the second decoration member 300-1. The display apparatus DS according to the present exemplary embodiment may use the light leaking from the display member by using the second decoration member 300-1 in the viewpoint of design of the display apparatus, and thus the appearance of the display apparatus DS may be improved.

Figure 7:
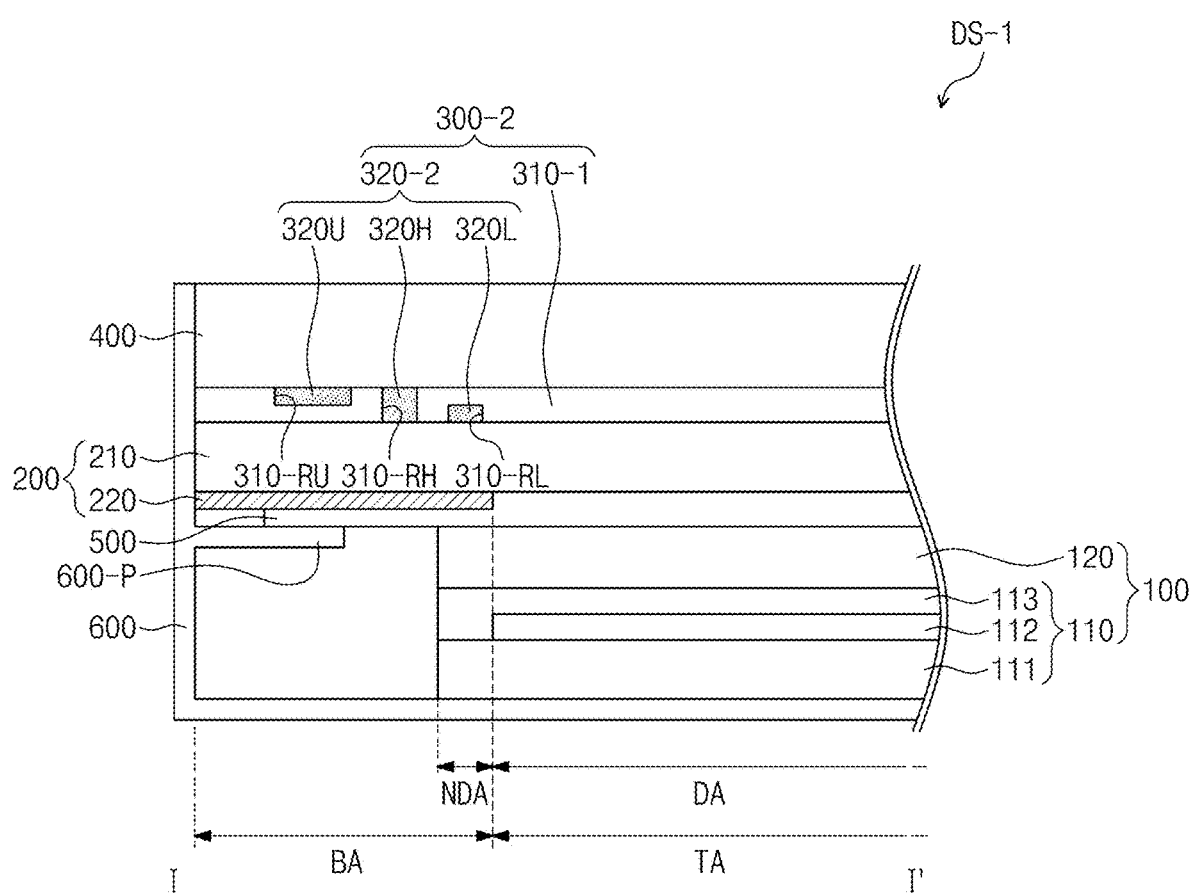
FIG. 7 is a partial cross-sectional view showing a display apparatus according to an exemplary embodiment of the present disclosure.

FIG. 7 is a partial cross-sectional view showing a display apparatus DS-1 according to an exemplary embodiment of the present disclosure. In FIG. 7, the same reference numerals denote the same elements in FIGS. 1 to 6C, and thus repeated detailed descriptions of the same elements will be omitted.

Referring to FIG. 7, the display apparatus DS-1 includes a base member 310-1 in which a plurality of recess portions 310-RU, 310-RH, and 310-RL are defined, and a filling member 320-2. The filling member 320-2 includes a plurality of filling members 320U, 320H, and 320L respectively filled in the recess portions 310-RU, 310-RL, and 310-RH.

The recess portions 310-RU, 310-RL, and 310-RH define spaces recessed from one or more surfaces of the base member 310-1 along a thickness direction of the base member 310-1. The recess portions 310-RU, 310-RL, and 310-RH include a first recess portion 310-RU, a second recess portion 310-RL, and a third recess portion 310-RH.

The first recess portion 310-RU defines the space recessed downward from a front surface of the base member 310-1. The second recess portion 320-RL defines the space recessed upward from a rear surface of the base member 310-1. Each of the first and second recess portions 310-RU and 310-RL has a depth smaller than a thickness of the base member 310-1.

The third recess portion 310-RH defines an opening penetrating through the base member 310-1. The third recess portion 310-RH has a depth substantially the same as the thickness of the base member 310-1.

The first, second, and third recess portions 310-RU, 310-RL, and 310-RH may have different depths from each other. The display apparatus DS-1 according to the present exemplary embodiment may include various transparent patterns using the depths and shapes of the first, second, and third recess portions 310-RU, 310-RL, and 310-RH.

Figure 8:
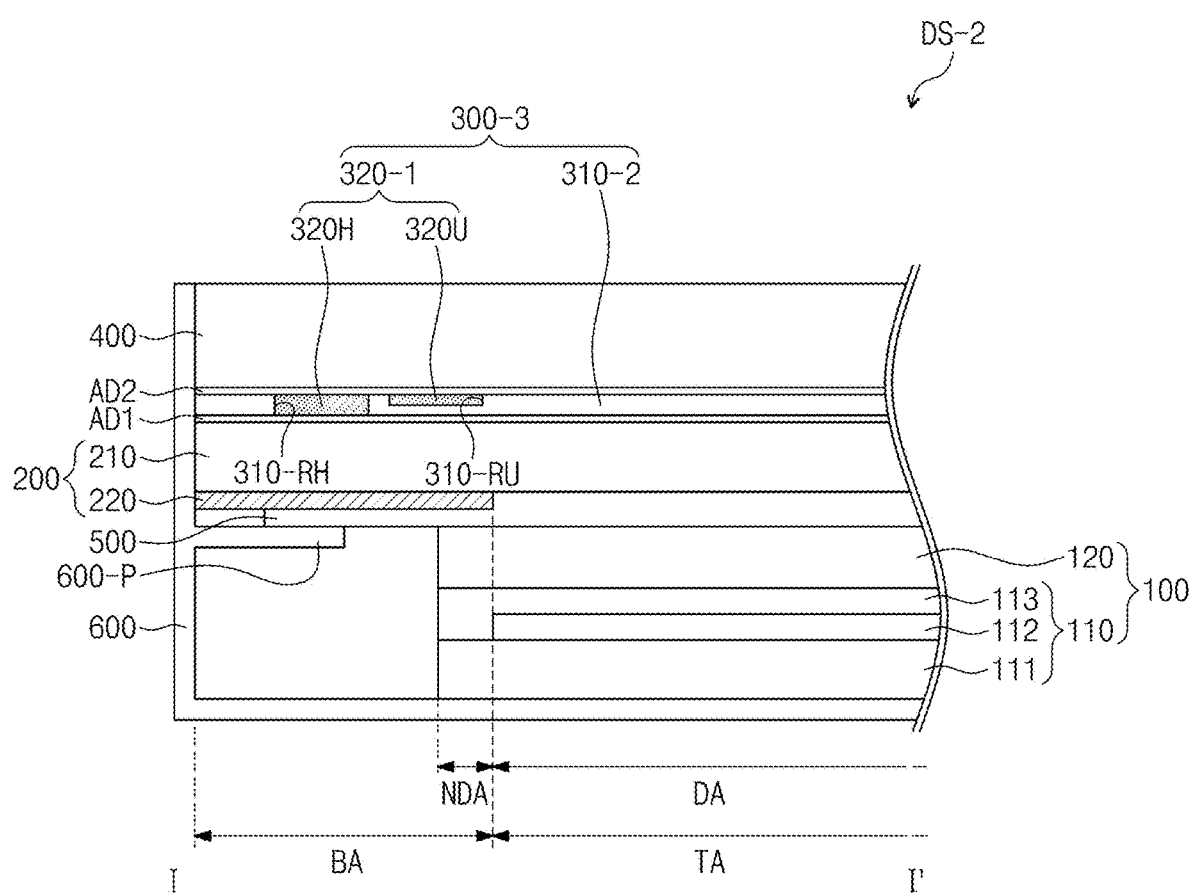
FIG. 8 is a partial cross-sectional view showing a display apparatus according to an exemplary embodiment of the present disclosure.

FIG. 8 is a partial cross-sectional view showing a display apparatus DS-2 according to an exemplary embodiment of the present disclosure. For convenience of explanation, FIG. 8 shows an area of the display apparatus DS-2, which corresponds to the cross-sectional view shown in FIG. 2B. In FIG. 8, the same reference numerals denote the same corresponding elements in FIGS. 1 to 7, and thus, repeated detailed descriptions of the same elements will be omitted.

Referring to FIG. 8, the display apparatus DS-2 may further include at least one adhesive layer, and may include a first adhesive layer AD1 and a second adhesive layer AD2.

In the present embodiment, a second decoration member 300-2 may include a base member 310-2 having no adhesion. The base member 310-2 includes a plurality of recess portions 310-RH and 310-RU defined therein. Details of the recess portions 310-RH and 310-RU are substantially the same as those described with reference to the display apparatus DS-1 of FIG. 7.

The base member 310-2 may be, but is not limited to, a transparent plastic film. For instance, the base member 310-2 may include at least one of polyethyleneterephthalate (PET), polymethylmethacrylate (PMMA), and polycarbonate (PC). Because the base member 310-2 includes a material having a relatively high transmittance, the visibility of the image of the display apparatus DS-2 may be improved.

The first and second adhesive layers AD1 and AD2 respectively couple the second decoration member 300-2 to other elements. The first adhesive layer AD1 is between the second decoration member 300-2 and the first decoration member 200 to couple the second decoration member 300-2 and the first decoration member 200.

The second adhesive layer AD2 is between the second decoration member 300-2 and the cover member 400 to couple the second decoration member 300-2 and the cover member 400.

First and second filling members 320H and 320U make contact with at least one of the first and second adhesive layers AD1 and AD2. As described above, each of the first and second filling members 320H and 320U has a refractive index that is lower than a refractive index of the layer making contact with one of the first and second filling members 320H and 320U.

For instance, the first filling member 320H may make contact with the first and second adhesive layers AD1 and AD2 because the first filling member 320H defines the opening. Accordingly, the first filling member 320H has the refractive index that is lower than the refractive index of the first adhesive layer AD1 and that is lower than the refractive index of the second adhesive layer AD2.

The second filling member 320U makes contact with the second adhesive layer AD2. Therefore, the second filling member 320U includes a material having a refractive index that is lower than the refractive index of the second adhesive layer AD2. As described above, the first and second filling members 320H and 320U have the refractive index that is lower than the refractive indices of the layers making contact with the first and second filling members 320H and 320U, and thus the visibility of the transparent pattern may be improved.

Figure 9:
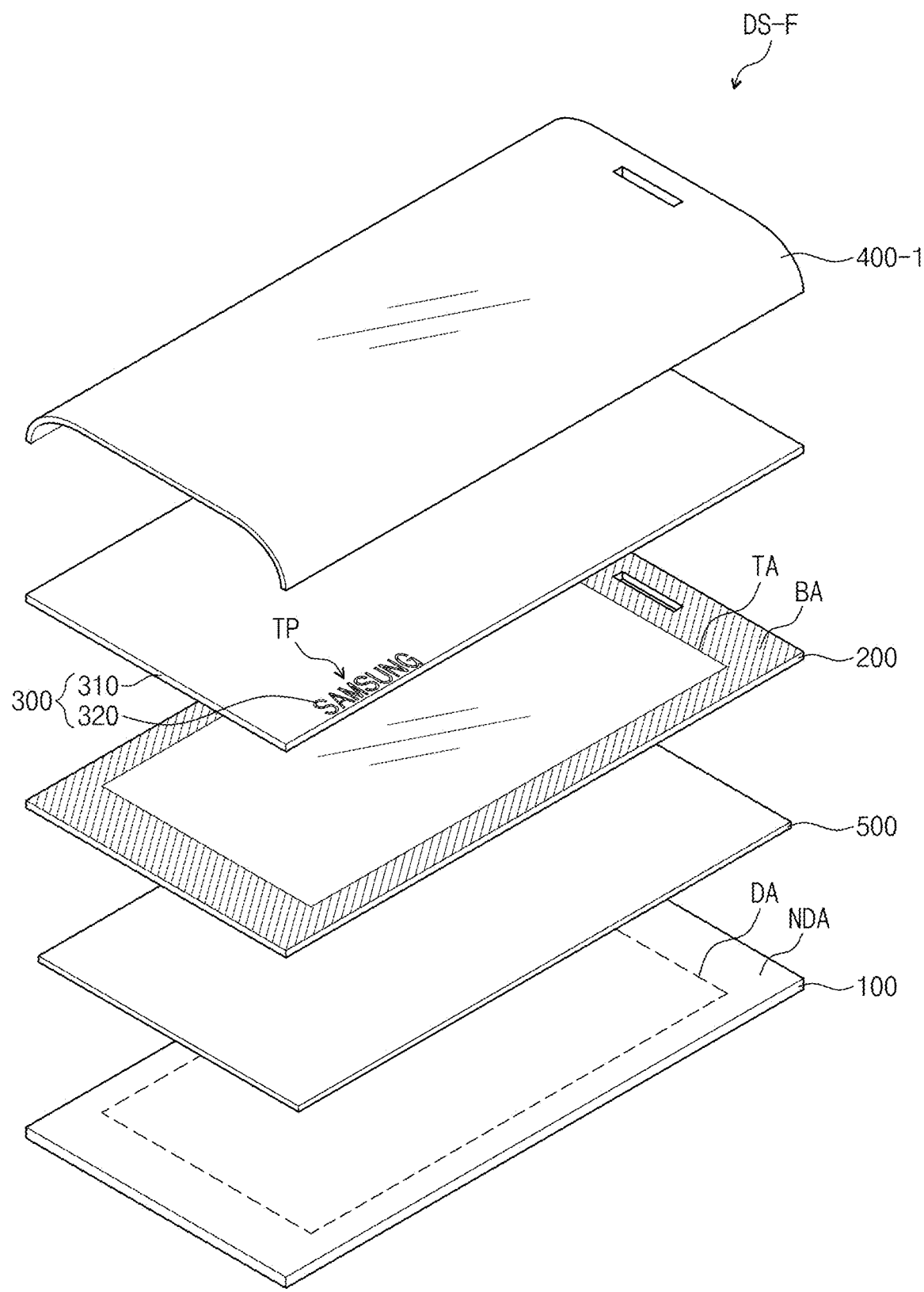
FIG. 9 is an exploded perspective view showing a display apparatus according to an exemplary embodiment of the present disclosure.
Figure 10A:
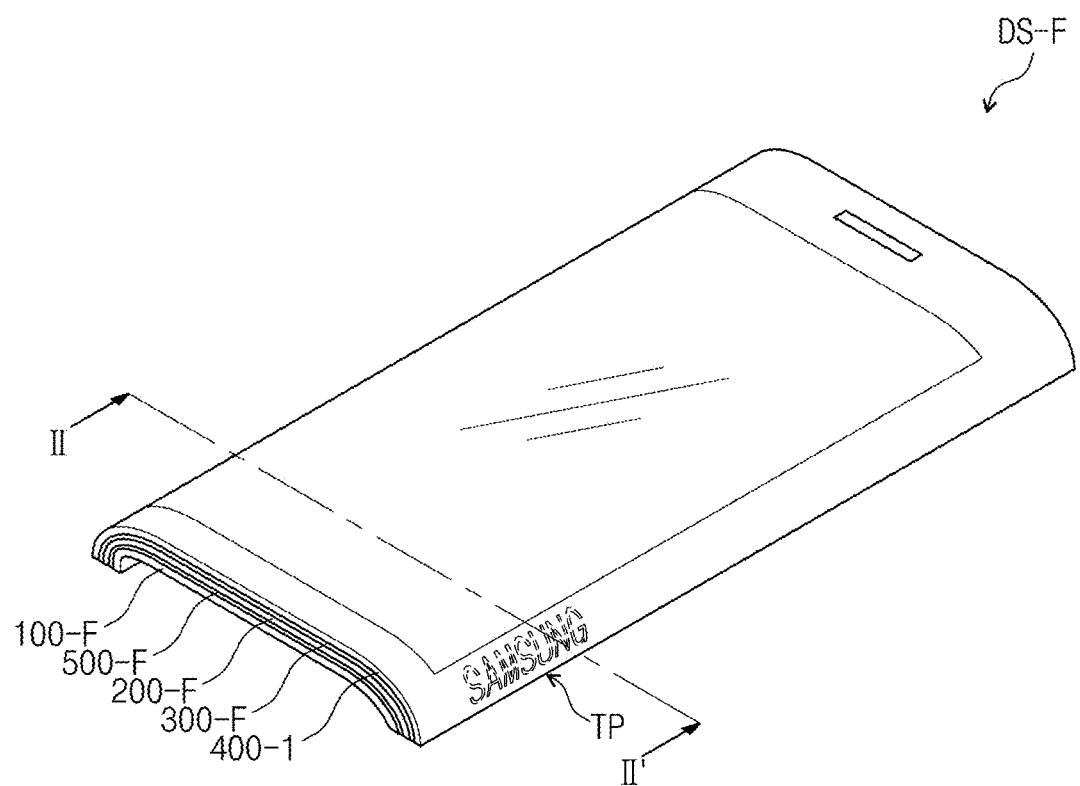
FIG. 10A is a perspective view showing the display apparatus shown in FIG. 9 after elements of the display apparatus are coupled to each other.
Figure 10B:
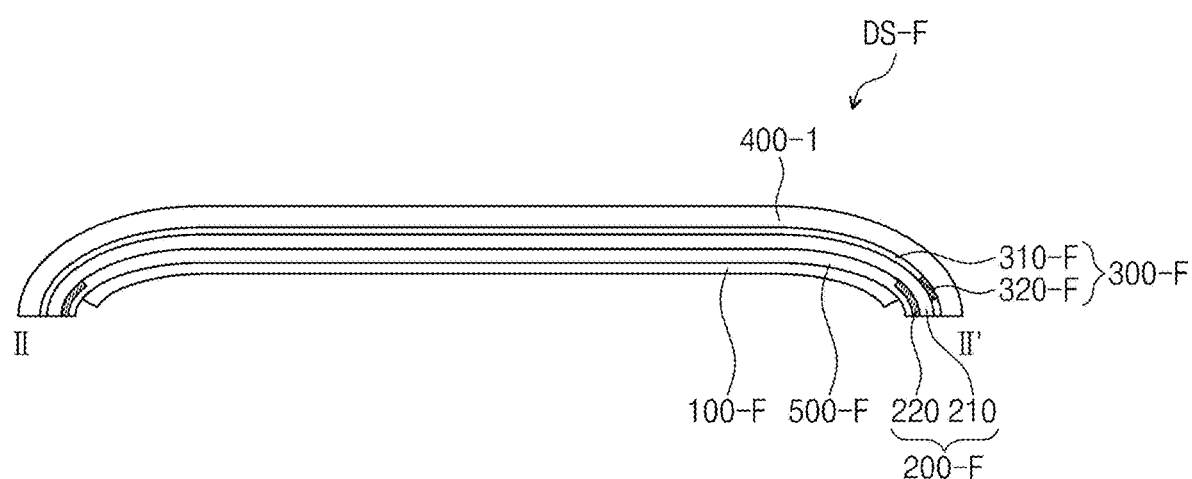
FIG. 10B is a cross-sectional view taken along the line II-II' of FIG. 10A.

FIG. 9 is an exploded perspective view showing a display apparatus DS-F according to an exemplary embodiment of the present disclosure, FIG. 10A is a perspective view showing the display apparatus DS-F shown in FIG. 9 after elements of the display apparatus are coupled to each other, and FIG. 10B is a cross-sectional view taken along the line II-II' of FIG. 10A. In FIGS. 9, 10A, and 10B, the same reference numerals denote the same respective elements in FIGS. 1 to 8, and thus repeated detailed descriptions of the same elements will be omitted.

Referring to FIGS. 9, 10A, and 10B, the display apparatus DS-F includes a cover member 400-1 that is bent. For the convenience of explanation, an accommodating member is omitted in FIGS. 9, 10A, and 10B.

The cover member 400-1 is bent toward a lower side with respect to a predetermined bending axis. Accordingly, the cover member 400-1 has a curved shape. The cover member 400-1 is fixed while being bent. Therefore, the cover member 400-1 is not deformed, even though external impacts are applied thereto, and is configured to protect elements accommodated therein.

The second decoration member 300 includes a transparent pattern TP. The transparent pattern TP is located at an area in the bezel area BA, which corresponds to the curved portion of the cover member 400-1.

Referring to FIGS. 10A and 10B, the display apparatus DS-F has a curved shape after being manufactured. The curved shape of the display apparatus DS-F corresponds to the curved shape of the cover member 400-1.

In this case, the display apparatus DS-F may include elements having flexibility. Accordingly, when the display apparatus DS-F is assembled, the display member 100, the first decoration member 200, the second decoration member 300, and the adhesive member 500 of the display apparatus DS-F are bent to have a shape corresponding to the bending shape of the cover member 400-1.

The assembled display apparatus DS-F includes the bent display member 100-F, the bent first decoration member 200-F, the bent second decoration member 300-F, and the bent adhesive member 500-F.

The transparent pattern of the second decoration member 300 may be disposed at the curved surface. Because the transparent pattern TP does not require a separate light source, and is realized in thin layers, the transparent pattern TP may be applied to display devices having various shapes. The display apparatus DS-F according to the present exemplary embodiment includes the second decoration member 300, and thus, the display apparatus DS-F may have improved appearance, and may be freely deformed.

Although the exemplary embodiments of the present invention have been described, it is understood that the present invention should not be limited to these exemplary embodiments but various changes and modifications can be made by one ordinary skilled in the art within the spirit and scope of the present invention corresponding to the following claims and their equivalents.

What is claimed is:

1. A display apparatus comprising:
 a display member in which a display area and a peripheral area are defined, the peripheral area adjacent the display area;
 a cover member on the display member;
 a first decoration member between the display member and the cover member, the first decoration member comprising a transmission layer, and a pattern layer that has a color and overlaps the transmission layer, wherein an upper surface of the pattern layer having the color entirely contacts the transmission layer, and the first decoration member having:
  a bezel area overlapping the peripheral area which is defined by the pattern layer; and
  a transmission area adjacent the bezel area, and overlapping the display area; and
 a second decoration member between the first decoration member and the cover member, and the second decoration member having:
  a base member in which at least one recess portion overlapping the bezel area is defined; and
  a filling member in the at least one recess portion, and having a refractive index that is lower than a refractive index of the base member, and
 wherein when the display apparatus is turned on, an area where the filling member is disposed is darker than an area corresponding to the base member in the bezel area adjacent the filling member because a light incident toward the filling member is difficult to travel toward the cover member due to the filling member having the refractive index that is lower than the refractive index of the base member, and
 wherein when the display apparatus is turned on, a light provided from the display member is reflected by the area where the filling member is disposed, and the light provided from the display member is transmitted in the area corresponding to the base member in the bezel area.

2. The display apparatus of claim 1, wherein the refractive index of the filling member is lower than a refractive index of a layer contacting the filling member, wherein a contact area of the transmission layer in contact with the pattern layer is substantially same as an area of the pattern layer in a plan view, and wherein the pattern layer overlaps an entirety of the filling member in a plan view.

3. The display apparatus of claim 2, wherein the base member comprises an adhesive material, and wherein the base member couples the cover member and the first decoration member.

4. The display apparatus of claim 2, wherein the base member comprises an optical clear adhesive, a pressure sensitive adhesive, or an optical clear resin.

5. The display apparatus of claim 4, wherein the layer contacting the filling member is the cover member.

6. The display apparatus of claim 2, further comprising an adhesive layer between the second decoration member and the cover member to couple the base member and the cover member.

7. The display apparatus of claim 6, wherein the base member comprises a transparent plastic film.

8. The display apparatus of claim 7, wherein the layer contacting the filling member is the adhesive layer.

9. The display apparatus of claim 1, wherein the at least one recess portion is recessed from one surface of the base member along a thickness direction of the base member.

10. The display apparatus of claim 9, wherein the at least one recess portion has a depth equal to, or smaller than, a thickness of the base member.

11. The display apparatus of claim 10, wherein the at least one recess portion is an opening penetrating through the base member and has the depth equal to the thickness of the base member.

12. The display apparatus of claim 9, wherein the at least one recess portion comprises:

a first recess portion defined by a front surface of the base member; and a second recess portion defined by a rear surface of the base member.

13. The display apparatus of claim 12, wherein a depth of the first recess portion is different than a depth of the second recess portion.

14. The display apparatus of claim 1, wherein the pattern layer has a white color.

15. The display apparatus of claim 1, wherein the second decoration member is directly on one surface of the cover member.

16. The display apparatus of claim 1, wherein the display member comprises:

a display panel which displays an image at the display area; and a touch panel which calculates coordinate information corresponding to an external touch input at the cover member.

17. The display apparatus of claim 16, wherein the display panel comprises:

a base substrate;

a display layer on the base substrate, and comprising at least one organic light emitting device at the display area; and a sealing layer on the display layer to seal the display layer.

18. The display apparatus of claim 1, wherein the cover member is bent with respect to a bending axis, and wherein the second decoration member is bent to correspond to a shape of the cover member.

19. The display apparatus of claim 1, wherein the display member is configured to display an image at the display area, and wherein the cover member covers the display area and the peripheral area, and is configured to transmit the image to be recognized on the cover member.

20. A display apparatus comprising:

a display panel in which a display area which display an image, and a peripheral area adjacent the display area are defined;

a cover member on the display panel;

a first decoration member between the display panel and the cover member, the first decoration member comprising a transmission layer and a pattern layer disposed on the transmission layer and having a color, and the first decoration member having:

a transmission area overlapping the display area; and a bezel area adjacent the transmission area and overlapping the peripheral area, the bezel area defined by the pattern layer; and a second decoration member between the first decoration member and the cover member, the second decoration member comprises a base member overlapping the transmission area and the bezel area, having a filling member therein, and comprising a transparent pattern member overlapping the bezel area, wherein when the display apparatus is turned on, an area where the filling member is disposed is darker than an area corresponding to the base member in the bezel area adjacent the filling member because a light incident toward the filling member is difficult to travel toward the cover member due to the filling member having a refractive index that is lower than the refractive index of the base member, and wherein when the display apparatus is turned off, a boundary between the area where the filling member is disposed and the area corresponding to the base member is not recognized.

21. The display apparatus of claim 20, wherein the base member has at least one opening overlapping the bezel area, wherein the filling member is in the at least one opening, and wherein the transparent pattern is defined by the filling member in the at least one opening.

22. The display apparatus of claim 21, wherein the base member comprises an optical clear adhesive, a pressure sensitive adhesive, or an optical clear resin.

23. The display apparatus of claim 22, wherein the base member couples the first decoration member and the cover member, and wherein the refractive index of the filling member is lower than a refractive index of the cover member.

24. The display apparatus of claim 21, wherein the base member comprises a plastic film.

25. The display apparatus of claim 24, further comprising an adhesive layer overlapping the at least one opening, and located between the base member and the cover member to couple the base member and the cover member.

26. The display apparatus of claim 25, wherein the filling member has a refractive index that is lower than a refractive index of the adhesive layer.

27. The display apparatus of claim 21, wherein the filling member comprises air.

28. The display apparatus of claim 21, wherein the filling member comprises a transparent polymer material.

29. The display apparatus of claim 21, wherein the pattern layer, the transparent pattern, and the transmission layer overlap each other in a plan view, wherein all of portion of the transmission layer overlapping the pattern layer contacts to the pattern layer,
wherein the pattern layer has a single surface contacting the transmission layer, and
wherein area of the single surface of the pattern layer is substantially the same as an area of the pattern layer in the plan view.

* * * * *